United States Patent [19]

Crisp et al.

[11] Patent Number: 4,937,108

[45] Date of Patent: Jun. 26, 1990

[54] CARRIER DEVICE FOR RELEASABLY HOLDING A STRIP OF MATERIAL

[75] Inventors: Rod Crisp, Aptos; Roger Tregear, San Jose; David Platt, Fremont, all of Calif.

[73] Assignee: Camtex Horizons, Inc., Fremont, Calif.

[21] Appl. No.: 267,097

[22] Filed: Nov. 4, 1988

[51] Int. Cl.$^5$ .............................................. A47G 1/12
[52] U.S. Cl. ..................................... 428/13; 428/131; 428/901; 73/517 R; 357/70; 357/81
[58] Field of Search ................. 73/517 R; 357/70, 81; 428/13, 131, 901

[56] References Cited

U.S. PATENT DOCUMENTS

| | | | |
|---|---|---|---|
| 4,007,479 | 2/1977 | Kowalski | 357/70 |
| 4,069,496 | 1/1978 | Kowalski | 357/70 |
| 4,183,627 | 1/1980 | Canerik | 350/247 |
| 4,600,611 | 7/1986 | Clark | 428/13 |
| 4,720,742 | 1/1988 | Egawa et al. | 357/81 |
| 4,782,589 | 11/1988 | Dennis | 357/70 |
| 4,788,864 | 12/1988 | Pier | 73/517 R |

Primary Examiner—Ellis P. Robinson
Assistant Examiner—P. J. Ryan
Attorney, Agent, or Firm—Glen R. Grunewal

[57] ABSTRACT

A carrier device for releasably holding a strip of material adapted for utilization and manufacture of semiconductor devices including first and second frame members interconnected by hinge means which permits both pivotal and linear movement of the frame members relative to one another.

19 Claims, 3 Drawing Sheets

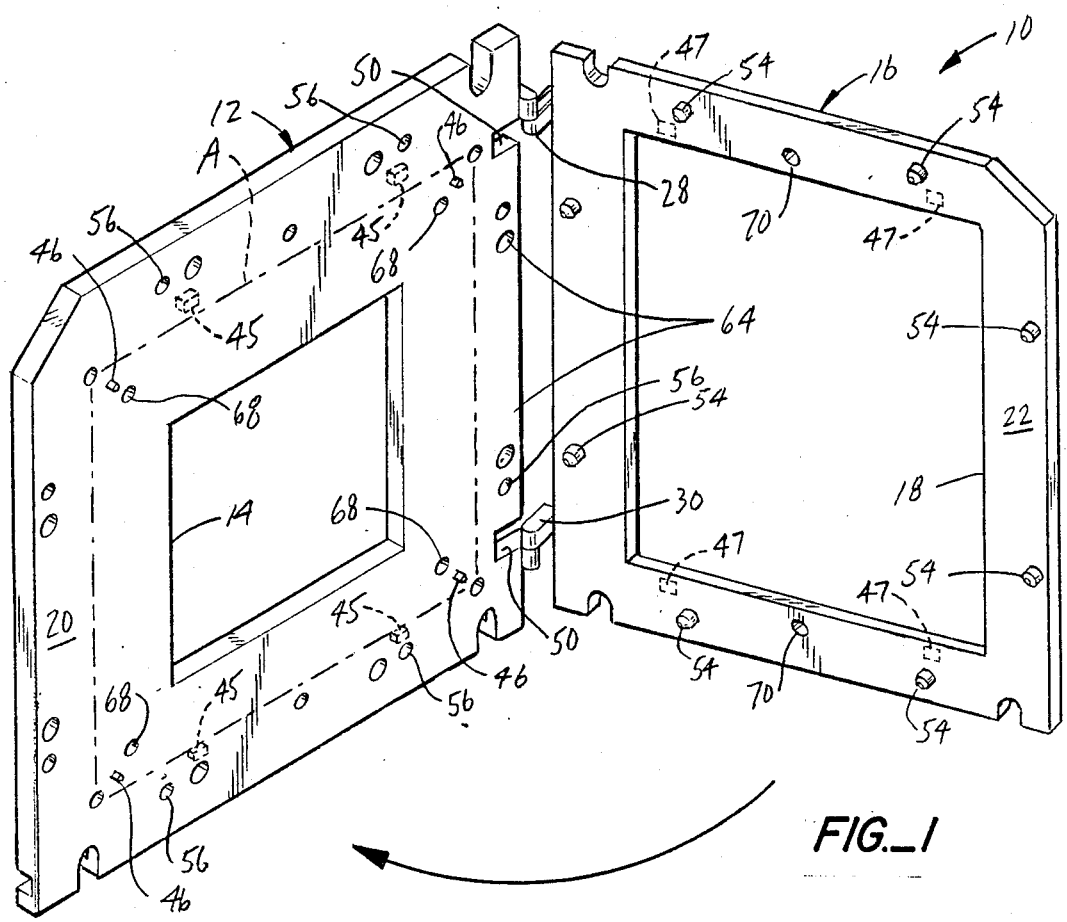
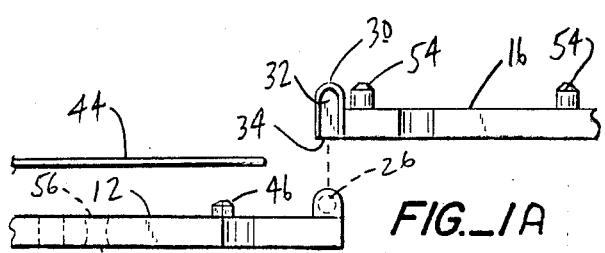
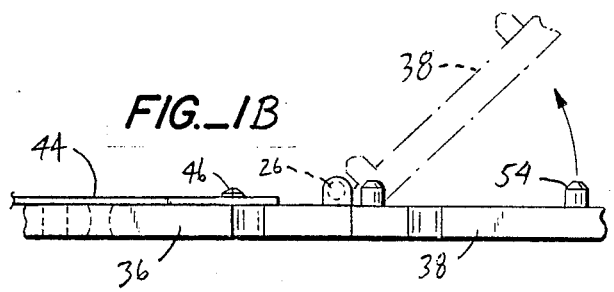
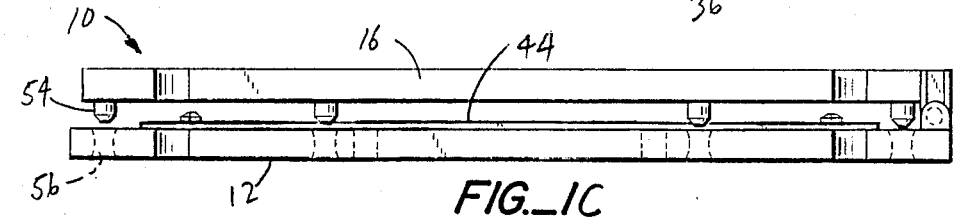
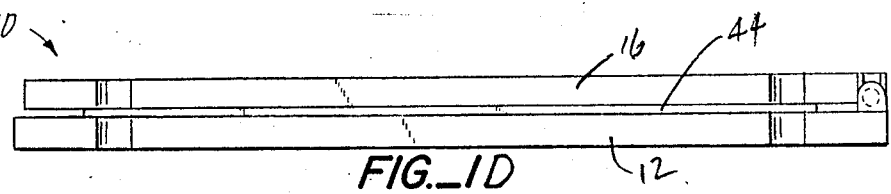

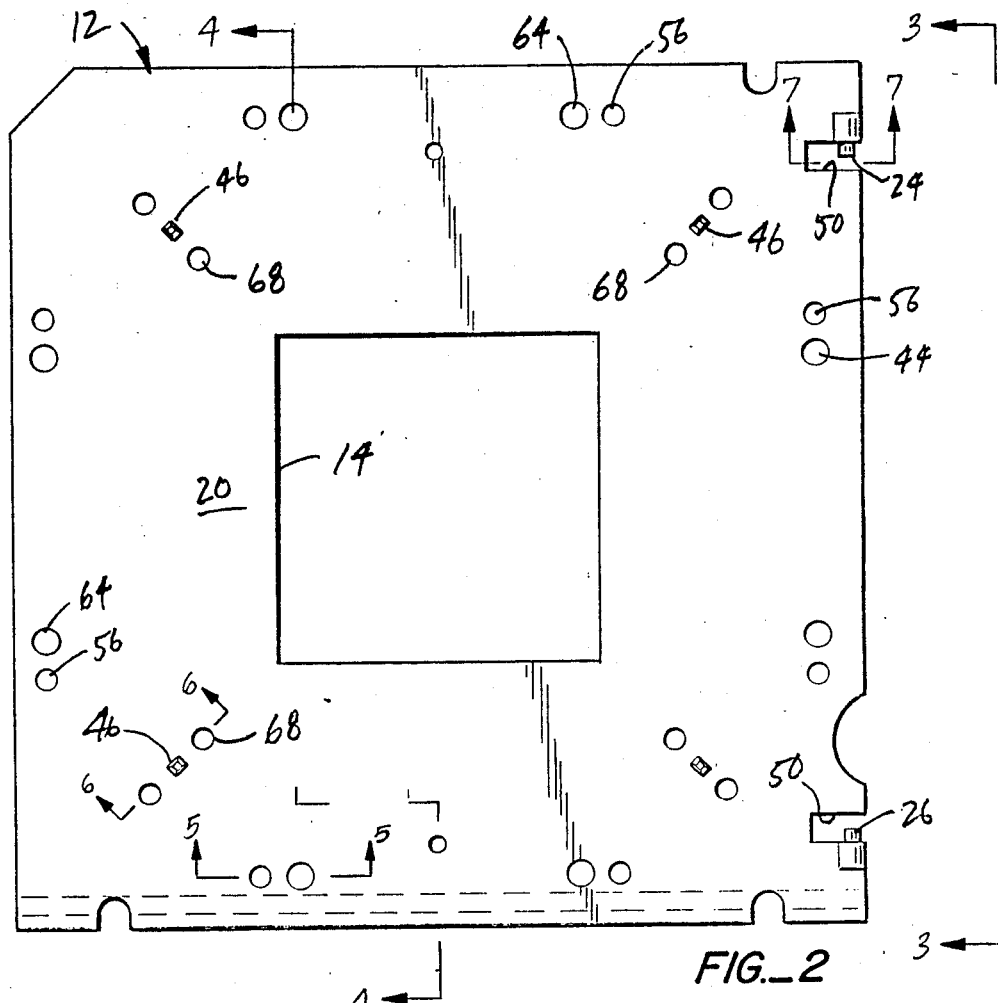
FIG._2
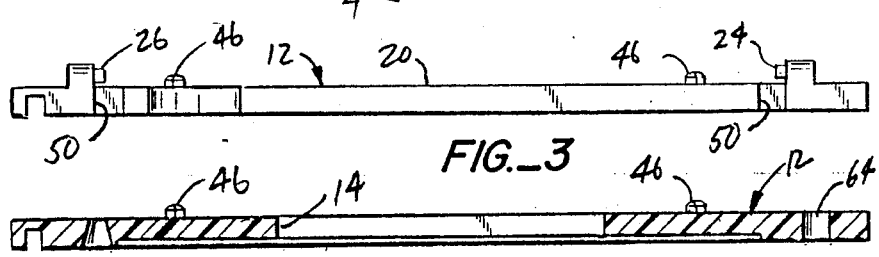
FIG._3
FIG._4
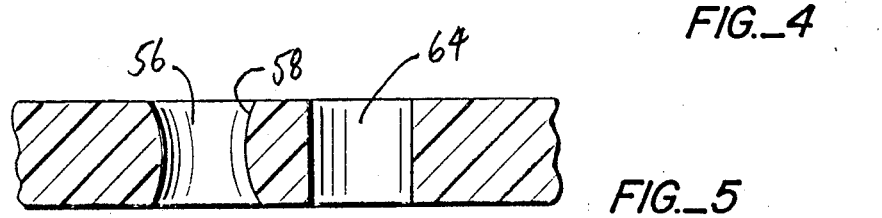
FIG._5
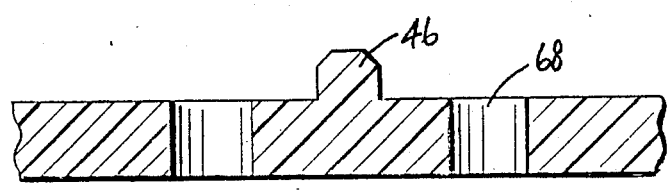
FIG._6

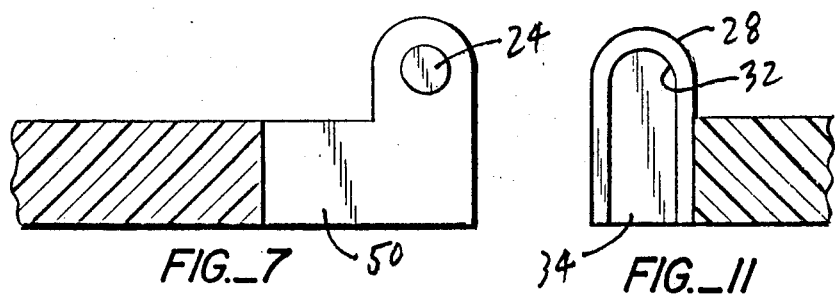
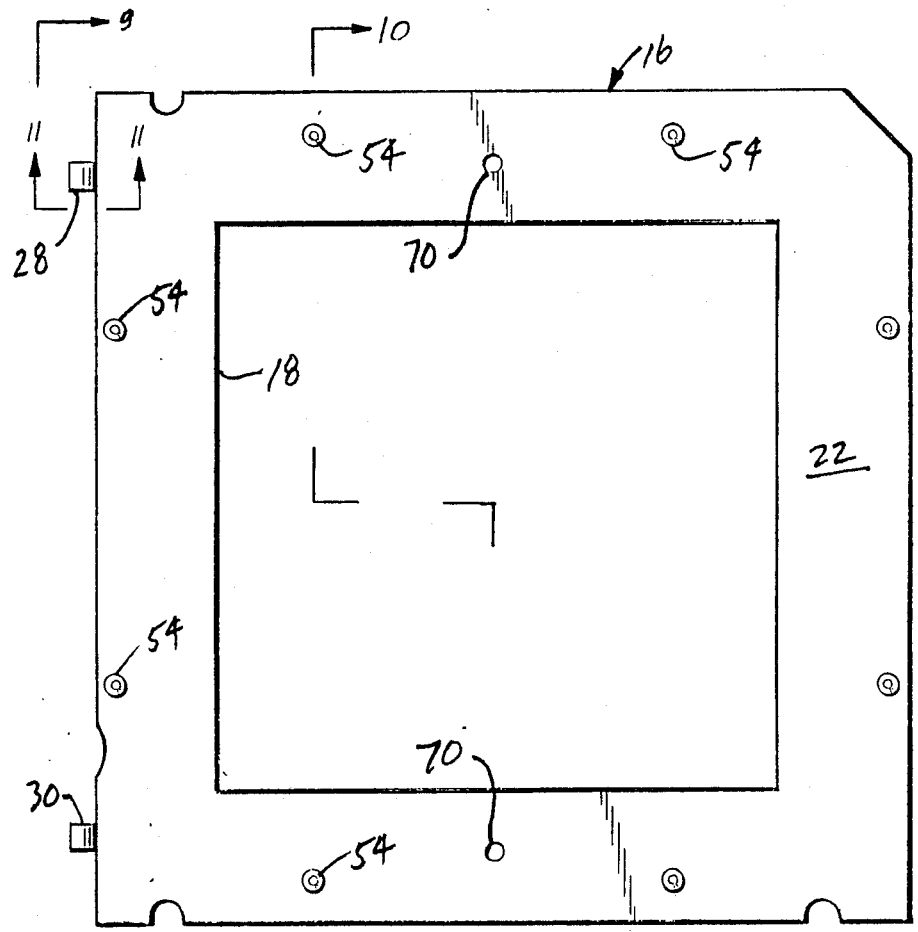
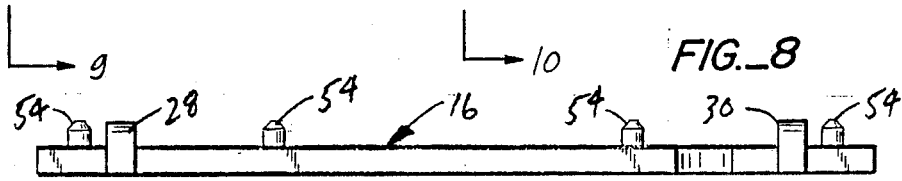
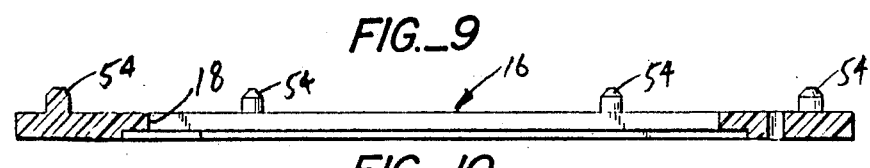

CARRIER DEVICE FOR RELEASABLY HOLDING A STRIP OF MATERIAL

TECHNICAL FIELD

The present invention relates to a carrier device for releasably holding a strip of material, such as film or tape material, employed in the manufacture of semiconductor devices.

BACKGROUND ART

A widely employed technique in the manufacture of semiconductor devices is the bonding of a semiconductor chip to an array of lead wires. According to one prior art approach, lead wire arrays are incorporated in film or tape strips adapted for bonding to chips. Frames are commonly utilized to carry, hold, and transport the strips during the aforesaid operation. The frames insure precise alignment of the strip to the chip so that the lead wire and chip contacts will engage and secure properly.

Exemplary of frame or carrier devices which have been used for such purpose are those disclosed in the following U.S. Pats.: U.S. Pat. No. 4,007,479, issued to Kowalski; U.S. Pat. No. 4,069,496, also issued to Kowalski; and U.S. Pat. No. 4,600,611, issued to Clark.

DISCLOSURE OF THE INVENTION

The carrier device of the present invention constitutes an improvement over the aforesaid prior art devices because it incorporates a number of features making the device particularly suitable and useful in automated operations. Such features facilitate automatic handling for framing, assembly, and disassembly.

The present carrier device includes a first frame member defining a first opening and a second frame member defining a second opening. Hinge means interconnects the first and second frame members and is adapted to permit pivotal movement between the frame members to a first relative position whereat the frame members are in at least partially superposed, generally parallel, spaced relationship. The hinge means is further adapted to permit substantially linear movement between the frame members, while maintaining the generally parallel relationship, from the first relative position to a second relative position at which the frame members sandwich the strip material therebetween and the strip material is located between the openings.

The hinge means comprises at least one hinge pin connected to one of the frame members and a socket for receiving the hinge pin connected to the other of the frame members. The socket defines an elongated interior permitting both pivotal and linear movement of the hinge pin.

The hinge pin and socket arrangement keeps the two frame members together during the assembly process. It also enables automatic handling for framing and assembly. The hinged pin and socket are releasably joined together so that, when desired, the frame members may be interchanged.

The carrier device of the present invention has other desirable features which contribute to the suitability of the device for automated processing. Among these is the employment of frame members of different sizes. The larger frame member incorporates a throughbore spaced from the hinge means. Thus, the larger frame member may be held in position and an injection element inserted into the throughbore to engage the other frame member, thereby exerting a force thereon and pivoting the other frame member about the hinge means to open the carrier device.

The present carrier device also incorporates at least one air hole in one of the frame members, the air holes so positioned as to underlie the strip of material and provide a passageway allowing application of pressurized air to the strip of material to remove it from the device after the device has been opened.

Other features, advantages, and objects of the present invention will become apparent with reference to the following detailed description and accompanying drawings.

BRIEF DESCRIPTION OF THE DRAWINGS

FIG. 1 is a perspective view of a preferred form of carrier device constructed in accordance with the teachings of the present invention;

FIGS. 1A-1B are fragmentary side views of the carrier device of FIG. 1 illustrating sequential steps being carried out in the use thereof;

FIGS. 1C and 1D are side views of the carrier device of FIG. 1 illustrating yet two further sequential steps in the operation thereof;

FIG. 2. is a plan view of one of the frame members of the carrier device;

FIG. 3 is a side view taken along the line 3—3 of FIG. 2;

FIG. 4 is a cross sectional view taken along line 4—4 of FIG. 2;

FIGS. 5 and 6 are enlarged, fragmentary, cross sectional views taken, respectively, along lines 5—5 and 6—6 in FIG. 2;

FIG. 7 is an enlarged, fragmentary, cross sectional view taken along line 7—7 of FIG. 8;

FIG. 8 is a plan view of another frame member employed in the carrier device of FIG. 2;

FIG. 9 is an end view of the frame member of FIG. 8 as taken along the line 9—9 of that figure;

FIG. 10 is a cross sectional view taken along the line 10—10 of FIG. 8; and

FIG. 11 is a fragmentary, enlarged, cross sectional view, taken along line 11—11 of FIG. 8.

BEST MODE FOR CARRYING OUT THE INVENTION

The present invention relates to a carrier device for releasably holding a strip of material, such as film or tape, adapted for utilization in the manufacture of semiconductor devices. Such strips of material are well known in the art and are employed, for example, to bond semiconductor chips to a lead wire array affixed to or in the strip material. U.S. Pat. No. 4,600,611, issued to Clark, may be referred to for an example of this type of strip material. The carrier device of the present invention allows for the ready handling and transport of the strip material during the bonding operation or for any other desired purpose. The carrier device performs the functions of providing precise placement of the strip material for the desired operation or operations, and protecting the strip material.

Referring now to FIG. 1, a carrier device 10 constructed in accordance with the teachings of the present invention is illustrated. The carrier device may be constructed of any suitable material, although a preferred material is polyether sulfone.

The carrier device 10 includes a first frame member 12 defining a first opening 14 and a second frame member 16 defining a second opening 18. Frame member 12 defines a planar surface 20 and frame member 16 defines a planar surface 22.

The carrier device includes hinge means interconnecting the frame members 12, 16. The hinge means is of a particular construction which enables the frame members to have a particular relative movement sequence which will be described in detail below.

The hinge means includes hinge pins 24, 26 (see FIGS. 2, 3, and 7) which are connected to frame member 12 by protrusions so that the hinge pins are spaced from the planar surface thereof as shown. The hinge means further comprises sockets 28, 30 connected to frame member 16. The sockets 28, 30 project outwardly from frame member 16, as shown, and are adapted to receive hinge pins 24, 26, respectively.

As perhaps best seen with reference to FIGS. 1A-1D and FIG. 11, each of the sockets defines an elongated interior 32. Also, each socket defines a socket opening 34 communicating with the elongated interior to facilitate selective placement of the hinge pin into the socket interior and removal of said hinge pin from the socket interior, in a manner which will now be described.

FIGS. 1A-1D show the sequential steps in the assembly of the carrier device 10. Frame member 16 is oriented with respect to frame member 12 so that the openings 34 of sockets 30 are positioned over the pins 24, 36. The frame members are then moved together so that the pins enter the elongated interiors of the sockets 28, 30. The sockets themselves enter notches 50 formed in frame member 12 below the hinge pins. After this has been accomplished, the frame members assume the relative positions shown in the solid line in FIG. 1B with the outer peripheral side walls 36, 38 of the frame members 12, 16, respectively, being in abutting engagement and the frame members being in substantially co-planar, side-by-side disposition. Thus, the frame members may only be pivotally moved with respect to one another in a single predetermined direction.

In FIGS. 1A-1D, a strip of material 44, such as a film or a tape, is shown in position on planar surface 20 of frame member 12. Such strip of material 44 has holes formed therein which accommodate locator pins 46 which project outwardly from planar surface 20. The strip of material illustrated is a 70 mm film frame and the strip occupies the area on frame member 12 delineated by the phantom line A shown in FIG. 1, for example. It will be appreciated, however, that the teachings of the present invention may be applied to other size or types of strips. For example, a film may have sprocket holes which would be positioned over optional locator pins 45 (shown in dotted line form in FIG. 1) which project outwardly from planar surface 20. Locator pins 45 would enter into corresponding apertures 47 (shown in dotted lines) in frame member 16.

After the strip of material 44 is in place, the frame members are pivoted together as shown by the arrow and phantom line presentation in FIG. 1B until such frame members occupy a first relative position illustrated in FIG. 1C. In such position, as may clearly be seen with reference to FIG. 1C, the frame members are in at least partially superposed, generally parallel, spaced relationship with the strip of material 44 disposed therebetween.

The frame members are then moved toward one another linearly, such movement being permitted by the elongated configuration of the socket interior. Linear movement continues until the frame members occupy the second relative position illustrated in FIG. 1B whereat the frame members sandwich the strip of material 44 therebetween and the strip of material is located between openings 14, 18. This linear movement is important for at least two reasons. First of all, the strip of material is not distorted by the frame members since the frame members generally uniformly contact the frame member when being brought together. Further, the linear movement facilitates the latching together of the frame members in a manner which will now be described.

The disclosed carrier device includes latch means for releasably latching the frame members together when the frame members are in the second relative position shown in FIG. 1D. The latch means comprises a plurality of latch pins disposed near the outer peripheral wall 38 of frame member 16 and projecting outwardly from planar surface 22. The latch pins have tapered ends and the latch pins are adapted to enter into corresponding chamfered latch holes 56 formed in frame member 12. As may perhaps best be seen with reference to FIGS. 1C and 5, the latch holes are tapered as at 58 to facilitate entry of the latch pins therein. Placement of the latch pins relative to the latch holes is facilitated by virtue of the fact that the frame members move linearly from the first relative position to the second relative position, with the result being, of course, that the latch pins and holes also come together linearly. With a purely pivotal arrangement, the pins would attack the holes at an angle and the strip of material between the frame members would also be engaged non-uniformly.

Preferably, hinge pins 24, 26 are slightly loosely accommodated within sockets 28, 30 so that relative skewing of the frame members is permitted when the frame members are not in the second relative position. This feature contributes to the proper placement of the latch pins relative to the latch holes. Even if the frame members are not precisely aligned when brought together, the tapered latch pins and chamfering of the latch holes will cause skewing to provide precise alignment. This also means that the dimensional tolerances of at least one of the frame members need not be absolutely precise. This obviously can help hold down manufacturing costs.

The present carrier device includes features which facilitate the opening of the carrier device as well as the closure thereof. In particular, in the illustrated embodiment, frame member 16 is larger than frame member 12, a condition which can be most appreciated with reference to FIG. 1D. This enables frame member 12 to be clamped into position by a suitable tool at the periphery thereof to hold the carrier device in place. Another way that frame member 12 differs from frame member 16 is that a plurality of throughbores 64 are defined by frame member 12. These throughbores are positionable under frame member 16 when the frame members are in their second relative position. Since the throughbores 64 ar spaced from the carrier device hinge means, suitable ejection elements such as pins (not shown) may be inserted upwardly into the throughbores and engage frame member 16. This would exert a force on frame member 16, thus opening the carrier device. While disengaged, the frame member 16 can be rotated about the hinge means. Obviously, such an arrangement lends itself to the automated opening of the carrier device.

Frame member 12 also has a plurality of air holes 68 formed therein, the air holes so positioned as to underlie the strip of material 44 and provide a passageway allowing the application of pressurized air to the underside of the strip of material. In other words, after the carrier device has been opened, a suitable source of pressurized air may be applied to the underside of frame member 12. This will efficiently remove the strip of material 44 from frame member 12 when desired.

The frame members 12, 16 may be disassembled from one another just as easily as they were assembled. It is preferred that the opening 34 of the socket be so dimensioned as to provide a slight force fit between the socket and the hinge pin. Such an arrangement will maintain the frame members together until suitable outside force is exerted.

It will be appreciated that various changes may be made to the disclosed embodiment without departing from the spirit or scope of the invention. For example, in the disclosed embodiment, the strip of material is held firmly in the device. The device can be modified to allow the strip of material to "float" therein by molding a recess in frame member 16 surrounding second opening 18. Holes 70 allow access to the strip of material from the outside to permit manipulation of the strip of material to obtain precise alignment.

We claim:

1. A carrier device for releasably holding a strip of material adapted for utilization in the manufacture of semiconductor devices, said carrier device comprising, in combination:
   a first frame member defining a first opening;
   a second frame member defining a second opening; and
   hinge means interconnecting said first and second frame members, said hinge means adapted to permit pivotal movement between said frame members to a first relative position whereat said frame members are in at least partially superposed, generally parallel, spaced relationship; and further adapted to permit substantially linear movement between said frame members while maintaining said generally parallel relationship from said first relative position to a second relative position whereat said frame members sandwich said strip of material therebetween and said strip of material is located between said openings.

2. The carrier device according to claim 1 wherein said hinge means comprises at least one hinge pin connected to one of said frame members and a socket for receiving said hinge pin connected to the other of said frame members, said socket defining an elongated interior permitting both pivotal and linear movement of said hinge pin therein.

3. The carrier device according to claim 2 wherein said socket defines a socket opening communicating with said elongated interior to facilitate selective placement of said hinge pin into said socket interior and removal of said hinge pin from said socket interior.

4. The carrier device according to claim 1 wherein one of said frame members is larger than the other of said frame members.

5. The carrier device according to claim 1 wherein one of said frame members defines at least one throughbore positionable under the other of said frame members when said frame members are in said second relative position, said throughbore being spaced from said hinge means and providing access for an ejection element engageable with said other frame member to exert a force thereon and pivot said other frame member about said hinge means.

6. The carrier device according to claim 2 wherein said frame members each define planar surfaces located adjacent to said strip of material when said frame members are in said second relative position, said hinge pin spaced from the planar surface of said one frame member and said socket projecting outwardly from said other frame member.

7. The carrier device according to claim 6 wherein said one frame member has a notch formed therein adjacent to said hinge pin, said notch adapted to accommodate the socket connected to the other of said frame members.

8. The carrier device according to claim 1 wherein said hinge means is adapted to permit substantially co-planar, side-by-side disposition of said frame members.

9. The carrier device according to claim 8 wherein said frame members each includes an outer peripheral side wall, the side walls of the frame members when in substantially co-planar, side-by-side disposition being in abutting engagement and cooperable with said hinge means to lock said frame members against pivotal movement in a predetermined direction.

10. The carrier device according to claim 7 wherein at least a portion of said hinge pin projects over said notch.

11. The carrier device according to claim 1 wherein at least one air hole is formed in at least one of said frame members, said air hole so positioned as to underlie said strip of material and provide a passageway allowing the application of pressurized air to said strip of material.

12. The carrier device according to claim 1 wherein said frame members are removeably attached by said hinge means.

13. The carrier device according to claim 1 additionally comprising latch means for releasably latching said frame members together when said frame members are in said second relative position.

14. The carrier device according to claim 13 wherein said latch means comprises at least one latch pin projecting from one of said frame members and a latch hole formed in the other of said frame members for receiving said latch pin, said other frame member tightly engaging said latch pin when in said latch hole.

15. The carrier device according to claim 14 wherein said latch pin includes a tapered end to facilitate entry of said latch pin into said latch hole.

16. The carrier device according to claim 14 wherein said latch hole is chamfered to facilitate entry of said latch pin therein.

17. The carrier device according to claim 2 wherein said hinge pin is loosely received within said socket whereby relative skewing of said frame members is permitted when said frame members are not in said second relative position.

18. A carrier device for releasably holding a strip of material adapted for utilization in the manufacture of semiconductor devices, said carrier device comprising, in combination:
   a first frame member defining a first opening and having a first planar surface positionable adjacent to a side of said strip material;
   a second frame member defining a second opening and a second planar surface positionable adjacent to another side of said strip material; and
   hinge means interconnecting said first and second frame members, said hinge means including at least one hinge pin connected to one of said frame members and spaced from the planar surface thereof and a socket connected to the other of said frame members and projecting outwardly from the planar surface thereof, said socket defining an interior for releasably receiving said hinged pin therein.

19. The carrier device according to claim 18 wherein said socket interior is elongated and permits both pivotal and linear movement of said hinge pin therein.

* * * * *